(12) United States Patent
Cha et al.

(10) Patent No.: US 7,781,302 B2
(45) Date of Patent: Aug. 24, 2010

(54) METHODS OF FABRICATING SEMICONDUCTOR DEVICES HAVING ISOLATION REGIONS FORMED FROM ANNEALED OXYGEN ION IMPLANTED REGIONS

(75) Inventors: Yong-Won Cha, Gyeonggi-do (KR);
Dae-Lok Bae, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 502 days.

(21) Appl. No.: 11/703,316

(22) Filed: Feb. 7, 2007

(65) Prior Publication Data
US 2007/0269957 A1    Nov. 22, 2007

(30) Foreign Application Priority Data
May 16, 2006   (KR)   ............ 10-2006-0043916

(51) Int. Cl.
*H01L 21/76* (2006.01)
(52) U.S. Cl. .............. 438/423; 438/218; 438/253; 257/349; 257/E21.545; 257/E21.563; 257/E21.339
(58) Field of Classification Search ............ 438/218, 438/294, 253, 400, 405, 423, 431, 451; 257/349, 257/E21.547, E21.545, E21.563, E21.339, 257/E21.537
See application file for complete search history.

(56) References Cited

U.S. PATENT DOCUMENTS

| | | | | |
|---|---|---|---|---|
| 5,795,627 | A | * | 8/1998 | Mehta et al. ............... 427/526 |
| 6,576,558 | B1 | * | 6/2003 | Lin et al. .................. 438/700 |
| 7,442,586 | B2 | * | 10/2008 | Dyer et al. ................. 438/149 |
| 2003/0186511 | A1 | | 10/2003 | Yiu et al. |
| 2003/0194846 | A1 | * | 10/2003 | Hovel et al. ............... 438/400 |
| 2007/0190739 | A1 | * | 8/2007 | Zundel et al. ............. 438/423 |

FOREIGN PATENT DOCUMENTS

| | | |
|---|---|---|
| JP | 05-326691 A | 12/1993 |
| JP | 5-326691 A | 12/1993 |
| JP | 06-291179 A | 10/1994 |

(Continued)

OTHER PUBLICATIONS

Korean Intellectual Property Office Action for Korean application 10-2006-0043916; dated Feb. 22, 2007.

(Continued)

*Primary Examiner*—W. David Coleman
*Assistant Examiner*—Su C Kim
(74) *Attorney, Agent, or Firm*—Myers Bigel Sibley & Sajovec, P.A.

(57) ABSTRACT

Methods of fabricating a semiconductor device include forming a mask pattern on a semiconductor substrate and which exposes defined regions of the semiconductor substrate. Oxygen ions are implanted into the defined regions of the semiconductor substrate using the mask pattern as an ion implantation mask. The oxygen ion implanted regions of the semiconductor substrate are annealed at one or more temperatures in a range that is sufficiently high to form silicon oxide substantially throughout the oxygen ion implanted regions by reacting the implanted oxygen ions with silicon in the oxygen ion implanted regions, and that is sufficiently low to substantially prevent oxidation of the semiconductor substrate adjacent to the oxygen ion implanted regions.

17 Claims, 4 Drawing Sheets

FOREIGN PATENT DOCUMENTS

| | | |
|---|---|---|
| JP | 1020050066612 A | 6/2005 |
| KR | 0143709 B1 | 8/1998 |
| KR | 2000-0004535 A | 1/2000 |

OTHER PUBLICATIONS

English translation of Korean Intellectual Property Office Action for Korean application 10-2006-0043916; dated Feb. 22, 2007.

Korean Notice of Allowability, KR 10-2006-0043916, Aug. 9, 2007.

\* cited by examiner

METHODS OF FABRICATING SEMICONDUCTOR DEVICES HAVING ISOLATION REGIONS FORMED FROM ANNEALED OXYGEN ION IMPLANTED REGIONS

CROSS-REFERENCE TO RELATED APPLICATION

This application claims priority under 35 U.S.C. §119 to Korean Patent Application No. 10-2006-0043916, filed on May 16, 2006, the disclosure of which is hereby incorporated herein by reference in its entirety.

FIELD OF THE INVENTION

The present invention relates to methods of fabricating semiconductor devices, and more particularly, to methods of forming isolation regions in semiconductor substrates between devices.

BACKGROUND

To avoid interference among adjacent integrated circuit devices, it is desirable to utilize an isolation technique to electrically and/or structurally isolate the devices and conductive lines associated therewith. To increase integration density, it is desirable to reduce not only the dimensions of the discrete devices, but also the area and width of isolation regions between the devices. How the isolation regions are formed may limit integration density, may affect the reliability of the devices, and/or may affect the performance of the devices.

Trench isolation techniques, including shallow trench isolation (STI) techniques, are widely used to isolate integrated circuit devices. A trench isolation technique can include forming a hard mask pattern that exposes field regions and covers active regions of a semiconductor substrate. The exposed field regions can be etched using the hard mask pattern as an etching mask to form trenches in the semiconductor substrate. The trenches can then be filled with an insulating material to form an isolation structure between devices.

However, as integration density is increased, it may be desirable to reduce the pitch of the hard mask pattern and to narrow the associated widths of the trenches formed in the field regions. Consequently, the aspect ratio of the height divided by the width of the trenches typically increases with increased integration density. It can become increasingly difficult to fill narrow trenches having a high aspect ratio, which may lead to unwanted voids and discontinuities in the insulating regions.

SUMMARY

In accordance with some embodiments of the present invention, a method of fabricating a semiconductor device includes forming a mask pattern on a semiconductor substrate which exposes defined regions of the semiconductor substrate. Oxygen ions are implanted into the defined regions of the semiconductor substrate using the mask pattern as an ion implantation mask. The oxygen ion implanted regions of the semiconductor substrate are annealed at one or more temperatures in a range that is sufficiently high to form silicon oxide substantially throughout the oxygen ion implanted regions by reacting the implanted oxygen ions with silicon in the oxygen ion implanted regions, and that is sufficiently low to substantially prevent oxidation of the semiconductor substrate adjacent to the oxygen ion implanted regions.

The oxygen ion implanted regions may be steam annealed at one or more temperatures in a range of about 400° C. to about 800° C. The steam annealing may be carried out in an ambient gas including argon, nitrogen, hydrogen, and/or oxygen. Alternatively or additionally, the oxygen ion implanted regions may be annealed using a laser beam. Before annealing the oxygen ion implanted regions using a laser beam, the semiconductor substrate may be preheated to above about 100° C. and maintaining at or above that temperature while annealing to reduce a temperature gradient between the laser heated regions of the semiconductor substrate and peripheral regions of the semiconductor substrate.

A plurality of stacked silicon oxide regions may be formed in the semiconductor substrate by: implanting oxygen ions at a first dose and with a first energy into the defined regions of the semiconductor substrate; implanting oxygen ions at a second dose, which is lower than the first dose, and with a second energy, which is lower than the first energy, into the defined regions of the semiconductor substrate; and implanting oxygen ions at a third dose, which is lower than the second dose, and with a third energy, which is lower than the third energy, into the defined regions of the semiconductor substrate. The defined regions of the semiconductor substrate may then be annealed to formed stacked silicon oxide regions therein. The first dose may be selected to be sufficiently high so that when the impurity ions implanted at the first dose are annealed, the resulting first silicon oxide regions of at least two laterally adjacent ones of the defined regions of the semiconductor substrate extend into one another to form a continuous first silicon oxide region extending across the at least two adjacent ones of the defined regions.

BRIEF DESCRIPTION OF THE DRAWINGS

The accompanying drawings, which are included to provide a further understanding of the invention and are incorporated in and constitute a part of this application, illustrate certain embodiments of the invention. In the drawings.

DETAILED DESCRIPTION OF EMBODIMENTS OF THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Figure 1:
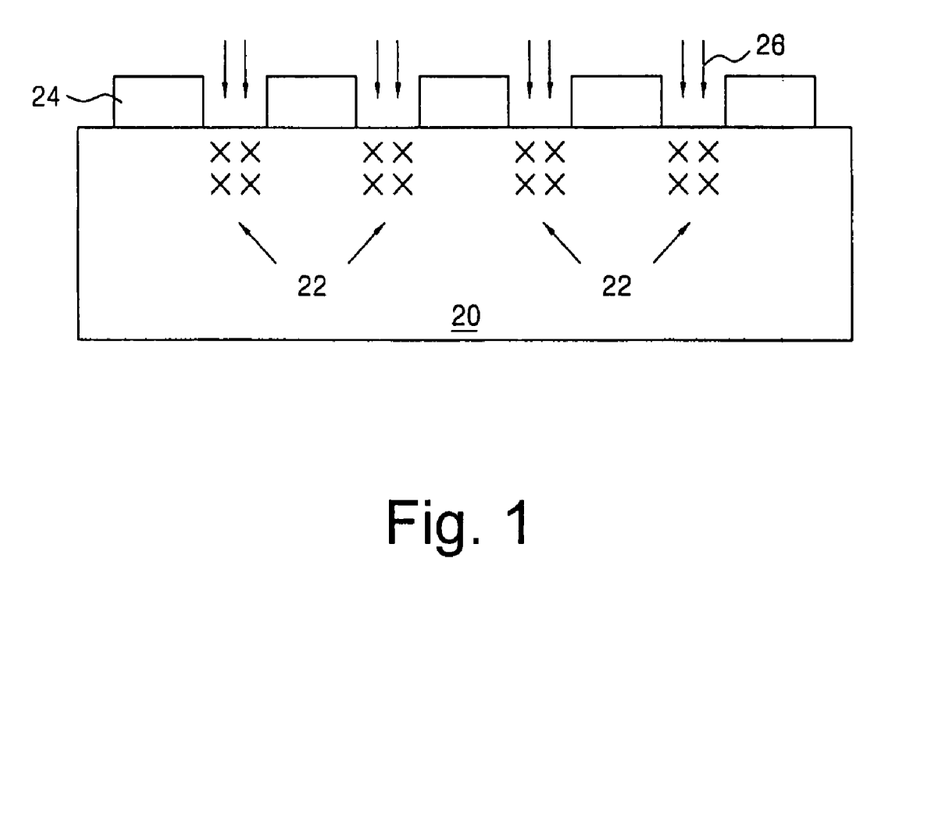
FIG. 1 is a cross-sectional view that illustrates methods of implanting oxygen ions into defined regions of a semiconductor substrate in accordance with some embodiments of the present invention.

Methods for fabricating silicon oxide isolation regions from oxygen ions implanted in a semiconductor substrate will now be described with reference to FIGS. 1-11 according to various embodiments of the present invention. Referring initially to FIG. 1, a mask pattern 24 is formed on a semiconductor substrate 20. The mask pattern 24 may include a photoresist material, silicon oxide, silicon nitride, silicon carbide, and/or a combination of one or more of these materials. Openings in the mask pattern 24 expose defined regions 22, such as field regions, of the semiconductor substrate 20. The mask pattern 24 may, for example, be formed by depositing a photoresist layer on the semiconductor substrate 20, and patterning the photoresist layer to form the mask pattern 24.

Oxygen ions 26 are implanted into the defined regions 22 of the semiconductor substrate 20 using the mask pattern 24 as an ion implantation mask. The oxygen ion implanted regions 22 correspond to damage regions within the semiconductor substrate 20. The oxygen ions 26 may be implanted into the defined regions 22 of the semiconductor substrate 20 at a dosage in a range of about $1.0 \times 10^{13}$ to about $1.0 \times 10^{19}$ ions/cm$^2$. However when the oxygen ions 26 are implanted at a dosage range of about $1.0 \times 10^{14}$ to about $1.0 \times 10^{15}$ ions/cm$^2$, the resulting oxygen ion implanted regions 22 may react more completely with silicon in the regions to form improved silicon oxide isolation regions when annealed in accordance with some embodiments of the present invention that will be described below.

Figure 3:
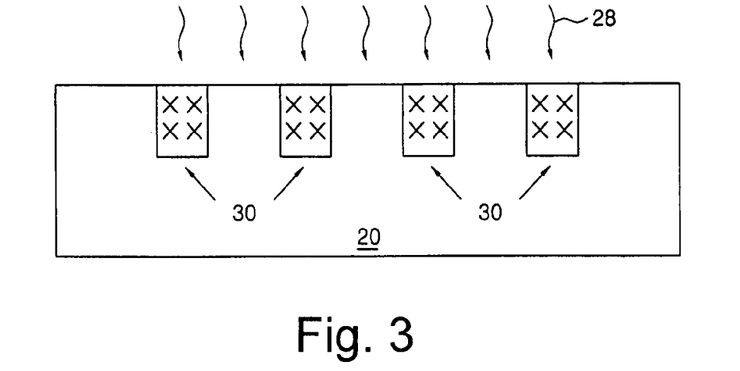
FIG. 3 is a cross-sectional view that illustrates methods of steam annealing the implanted oxygen ions to form silicon oxide isolation regions in the semiconductor substrate in accordance with some embodiments of the present invention.
Figure 4:
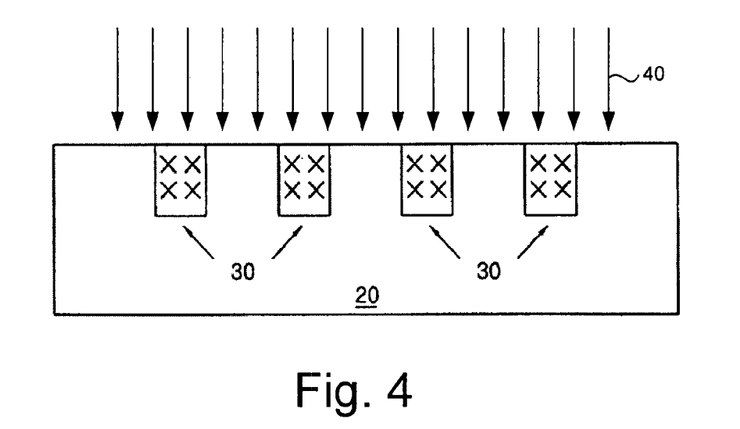
FIG. 4 is a cross-sectional view that illustrates methods of laser annealing the implanted oxygen ions to form silicon oxide isolation regions in the semiconductor substrate in accordance with some embodiments of the present invention.
Figure 5:
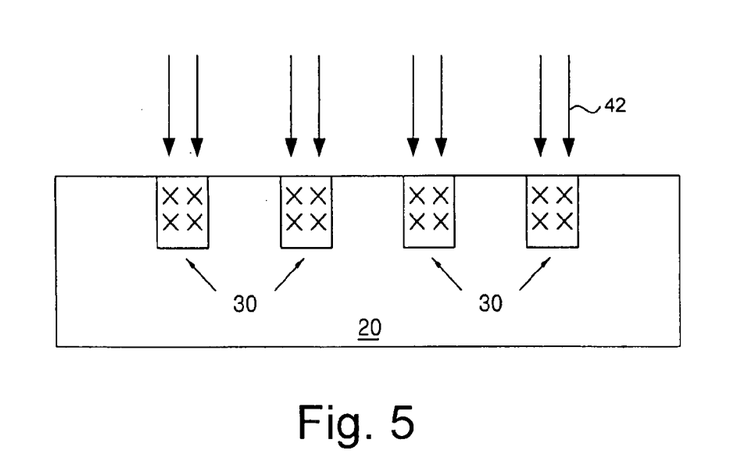
FIG. 5 is a cross-sectional view that illustrates further methods of laser annealing the implanted oxygen ions to form silicon oxide isolation regions in the semiconductor substrate in accordance with some embodiments of the present invention.

As will be discussed in more detail below, the oxygen ion implanted regions 22 are annealed at one or more temperatures in a range that is sufficiently high to form silicon oxide substantially throughout the oxygen ion implanted regions 22 by reacting the implanted oxygen ions with silicon in the regions 22 to form silicon oxide regions 30 (FIGS. 3-5). The annealing temperature(s) are also sufficiently low to substantially prevent oxidation of the semiconductor substrate 20 adjacent to the oxygen ion implanted regions 22, such as to substantially prevent oxidation of major regions of the semiconductor substrate that are immediately adjacent to the oxygen ion implanted regions 22.

Figure 2:
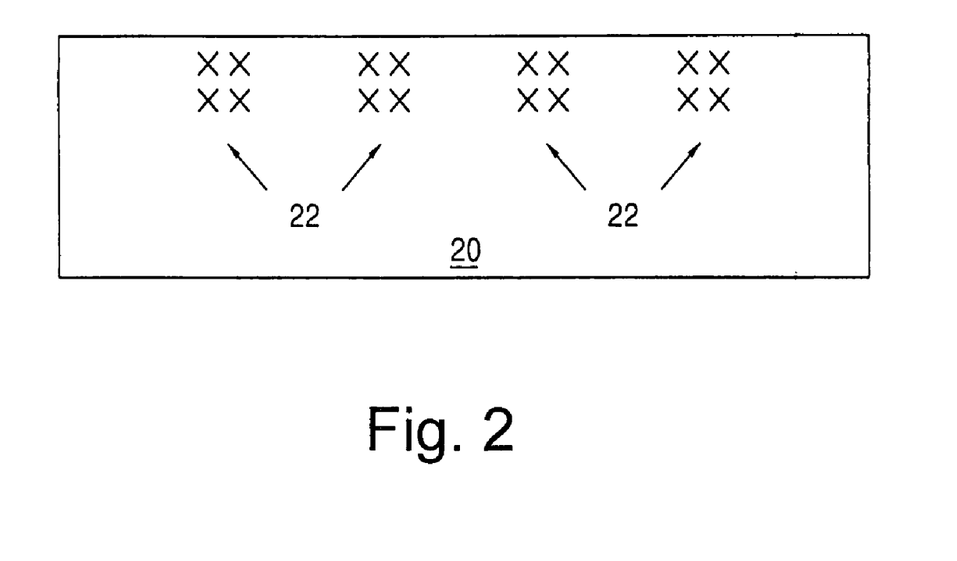
FIG. 2 is a cross-sectional view that illustrates methods of preparing the semiconductor substrate with implanted oxygen ions for annealing in accordance with some embodiments of the present invention.

In FIG. 2, the mask pattern 24 has been removed from the semiconductor substrate 20 before the oxygen ion implanted regions 22 are annealed. When the mask pattern 24 is formed from a photoresist material, removing it before annealing the oxygen ion implanted regions 22 may prevent the photoresist material from contaminating the semiconductor substrate 20 as a consequence of the annealing.

However, when the mask pattern 24 is formed from a silicon oxide, silicon nitride, and/or silicon carbide material, the mask pattern 24 may remain on the semiconductor substrate 20 while annealing to inhibit oxidation of regions of the semiconductor substrate 20 which are covered by the mask pattern 24. The mask pattern 24 may then be removed after annealing of the oxygen ion implanted regions 22 is completed.

FIG. 3 is a cross-sectional view that illustrates methods of steam annealing the oxygen ion implanted regions 22 to the form the silicon oxide regions 30. The semiconductor substrate 20 including the oxygen ion implanted regions 22 is heated with a steam vapor 28 at one or more temperatures in a range of about 400° C. to about 800° C. The steam vapor 28 may be formed in a furnace or by a rapid thermal annealing process, and may be formed in an ambient gas including nitrogen, hydrogen, oxygen, and/or an inactive gas such as argon. While annealing, the concentration of the steam vapor 28 to ambient gas may have a molecular weight ratio in a range of about 5% to about 100%. The oxygen ion implanted regions 22 are heated for a sufficient length of time to react the implanted oxygen ions with silicon substantially throughout the oxygen ion implanted regions 22 to form the silicon oxide regions 30.

By annealing the oxygen ion implanted regions 22 with steam vapor 28, a relatively low temperature may be used to react the oxygen ions with the silicon in the oxygen ion implanted regions 22 to form the silicon oxide regions 30. Moreover, the oxygen ions 26 (FIG. 1) may be implanted at a lower dosage because, while annealing, the steam vapor 28 can serve as an additional source of oxygen to the oxygen ion implanted regions 22 to assist with formation of the silicon oxide regions 30, and which may improve the speed and/or the operational yield from the fabrication process.

As an alternative or in addition to the steam annealing methods described with regard to FIG. 3, the oxygen ion implanted regions 22 may be heated with a laser beam to react the implanted oxygen ions with silicon in the oxygen ion implanted regions 22 and form the silicon oxide regions 30. FIG. 4 is a cross-sectional view that illustrates methods of annealing the oxygen ion implanted regions 22 using a laser beam 40 in accordance with some embodiments of the present invention. The laser beam 40 may be generated using a Nd Yttrium-Aluminum-Garnet (YAG) laser apparatus, a carbon dioxide laser apparatus, an excimer laser apparatus, and/or other laser apparatus.

The laser beam 40 may be simultaneously applied to a relatively wide region of the semiconductor substrate 20 that includes a plurality of the oxygen ion implanted regions 22, as shown in FIG. 4, or it may be controlled so that it is sequentially applied to different ones of the oxygen ion implanted regions 22. For example, as shown in FIG. 5, a laser beam 42 may be controlled, such as by focusing the laser beam 42 to about the cross-sectional area of individual ones of the oxygen ion implanted regions 22, and modulating the laser beam 42 on/off while scanning the laser beam 42 across the semiconductor substrate 20. The laser beam 42 can thereby be controlled to sequentially heat individual ones of the oxygen ion implanted regions 22 to a sufficient temperature to sequentially form the silicon oxide regions 30, and while avoiding heating of adjacent regions of the semiconductor substrate 20 to a temperature sufficient to cause oxidation of the adjacent regions.

When the oxygen ion implanted regions 22 are heated with a laser beam to form the silicon oxide regions 30, the semiconductor substrate 20 may be preheated (e.g., within a furnace) before the laser beam is generated. Preheating the semiconductor substrate 20 reduces a relatively large temperature gradient that may otherwise result when the oxygen ion implanted regions 22 are rapidly heated by a laser beam to elevated temperatures while the peripheral portions of the semiconductor substrate 20 remain at about the same temperature as before the laser bean heated the oxygen ion implanted regions 22. The semiconductor substrate 20 may, for example, be preheated to above about 100° C. and maintained at one or more temperatures above about 100° C. while the oxygen ion implanted regions 22 are heated with a laser beam, thereby reducing the temperature gradient between the laser heated regions of the semiconductor substrate 20 and peripheral regions of the semiconductor substrate 20.

Figure 6:
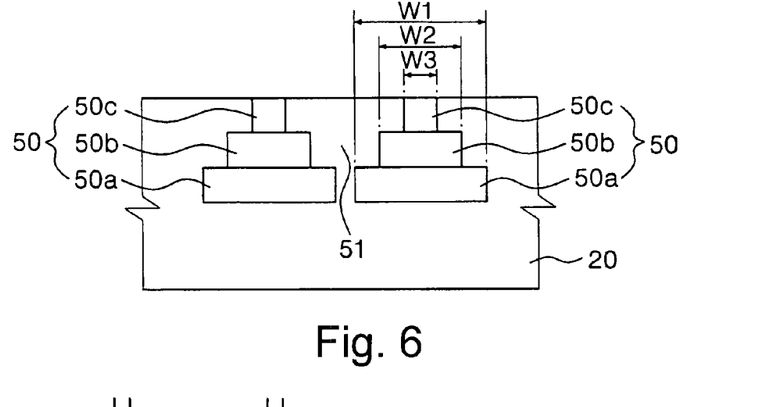
FIG. 6 is a cross-sectional view that illustrates methods of forming at least three silicon oxide isolation regions at different depths and widths in the semiconductor substrate in accordance with some embodiments of the present invention.

Methods for forming a plurality of stacked oxide isolation regions 50 at different depths and having different widths in the semiconductor substrate 20 will now be described with reference to FIGS. 6-11 in accordance with some embodiments of the present invention. Referring to FIG. 6, the stacked oxide isolation regions 50 include three pairs of silicon oxide regions 50a-c. A first pair of the silicon oxide regions 50a, which can serve as first field oxide regions, have been formed with a width W1 in the semiconductor substrate 20. A second pair of silicon oxide regions 50b, which can serve as second field oxide regions, have been formed with a width W2 and are less deep in the semiconductor substrate 20 than the first silicon oxide regions 50a. A third pair of silicon oxide regions 50c, which can serve as third field oxide regions, have been formed with a width W3 and are less deep in the semiconductor substrate 20 than the second first silicon oxide regions 50b. An active region 51 is thereby formed between the plurality of stacked oxide isolation regions 50.

Figure 7:
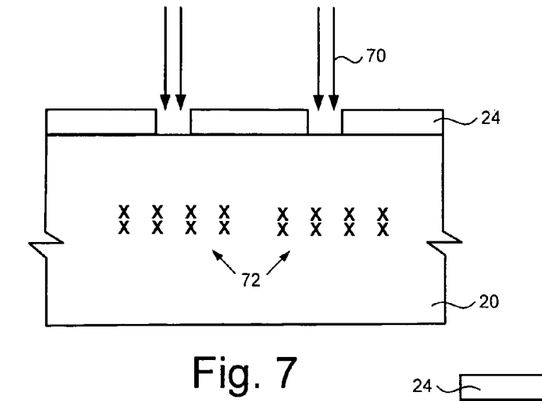
FIG. 7 is a cross-sectional view that illustrates methods of implanting oxygen ions at a high first dose and energy into defined regions of the semiconductor substrate in accordance with some embodiments of the present invention.
Figure 8:
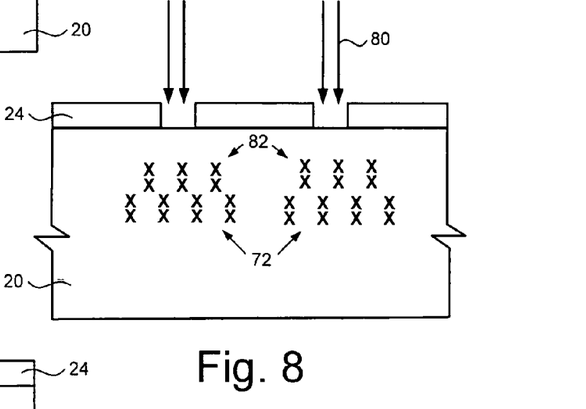
FIG. 8 is a cross-sectional view that illustrates methods of implanting oxygen ions at a lower second dose and energy into defined regions of the semiconductor substrate of FIG. 7 in accordance with some embodiments of the present invention.
Figure 9:
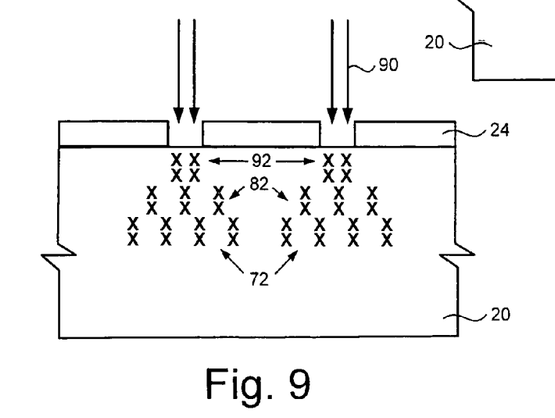
FIG. 9 is a cross-sectional view that illustrates methods of implanting oxygen ions at a yet lower third dose and energy into defined regions of the semiconductor substrate of FIG. 7 in accordance with some embodiments of the present invention.

FIGS. 7-9 are cross-sectional views of the semiconductor substrate 20 that illustrate methods of forming three depths and widths of oxygen ion implantation regions, and which may be annealed to form the plurality of stacked oxide isolation regions 50 shown in FIG. 6 according to some embodiments of the present invention. The dose at which the oxygen ions are implanted into the semiconductor substrate 20 can be varied to vary the resulting width of the oxygen ion implantation regions. The energy at which the oxygen ions are implanted into the semiconductor substrate 20 can be varied to vary the resulting depth of the oxygen ion implantation regions in the semiconductor substrate 20. Although the ion implantation regions and resulting silicon oxide regions have been shown as having the same width and depth, it is to be understood that they may be formed having different widths and/or depths relative to one another.

Referring to FIG. 7, oxygen ions are implanted at a first dose and with a first energy into defined regions of the semiconductor substrate 20 using the mask pattern 24 as an ion implantation mask to form first oxygen ion implanted regions 72. Referring to FIG. 8, oxygen ions are implanted at a second dose, which is less than the first dose, and with a second energy, which is less than the first energy, into defined regions of the semiconductor substrate 20 using the mask pattern 24 as an ion implantation mask to form second oxygen ion implanted regions 82. Referring to FIG. 9, oxygen ions are implanted at a third dose, which is less than the second dose, and with a third energy, which is less than the second energy, into defined regions of the semiconductor substrate 20 using the mask pattern 24 as an ion implantation mask to form third oxygen ion implanted regions 92.

As described above and shown in FIGS. 7-9, the first oxygen ion implanted regions 72 are formed deeper and wider within the semiconductor substrate 20 than the second oxygen ion implanted regions 82 because the oxygen ions 70 are implanted with a higher dose and energy than the oxygen ions 80. Similarly, the second oxygen ion implanted regions 82 are formed deeper and wider within the semiconductor substrate 20 than the third oxygen ion implanted regions 92 because the oxygen ions 80 are implanted with a higher dose and energy than the oxygen ions 90.

The first, second, and third oxygen ion implanted regions 72, 82, and 92 may then be annealed using similar methods as describe above with regard to FIGS. 3-5 to form silicon oxide substantially throughout the corresponding first, second, and third silicon oxide regions 50a, 50b, and 50c shown in FIG. 6. Alternatively, the first, second, and third oxygen ion implanted regions 72, 82, and 92 may be separately annealed between each of the sequential implantations thereof (i.e., anneal the first oxygen ion implanted region 72 before forming the second oxygen ion implanted region 82, and anneal the second oxygen ion implanted region 82 before forming the third oxygen ion implanted region 90).

Although various embodiments have been described in the context of forming three stacked silicon oxide regions by implanting oxygen ions at three different dosage and energy levels, it is to be understood that the invention is not limited thereto, and that any number of stacked silicon oxide regions may be formed by implanting oxygen ions at more or less different dosage and energy levels.

Figure 10:
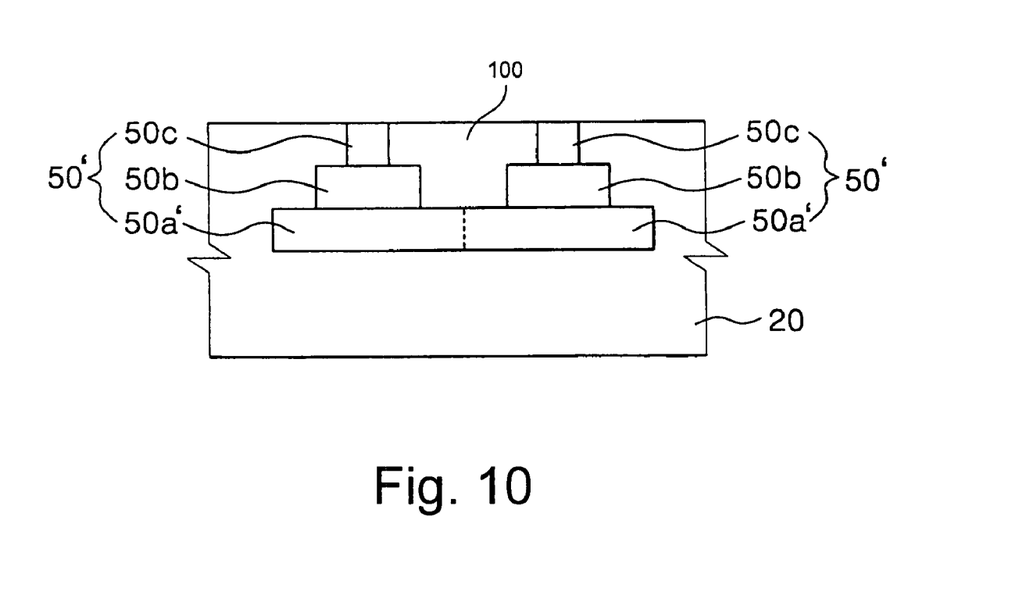
FIG. 10 is a cross-sectional view that illustrates methods of forming a plurality of silicon oxide isolation regions at different depths and widths in the semiconductor substrate, and in which two adjacent ones of the isolation regions extend into one another form to form a continuous silicon oxide isolation region extending therebetween in accordance with some embodiments of the present invention.

FIG. 10 is a cross-sectional view that illustrates methods of forming stacked oxide isolation regions 50' in which two laterally adjacent ones of the isolation regions extend into one another form to form a continuous silicon oxide isolation region extending therebetween in accordance with some embodiments of the present invention. Referring to FIG. 10, the first dose at which the oxygen ions 70 are implanted is selected to be sufficiently high so that two laterally adjacent oxygen ion implanted regions have a sufficient width to extend into one another. Consequently, when the adjacent oxygen ion implanted regions are annealed, a continuous first silicon oxide region 50a' is formed that extends across the laterally adjacent regions.

The stacked oxide isolation regions 50' define an active region 100 in the semiconductor substrate 20. The active region 100 is isolated from other peripheral regions of the semiconductor substrate 20 by the first, second, and third silicon oxide regions 50a', 50b, and 50c which surround the active region 100. Because the first silicon oxide regions 50a' extends continuously across a bottom of the active region 100, the stacked oxide isolation regions 50' form a silicon-on-insulator type structure.

Figure 11:
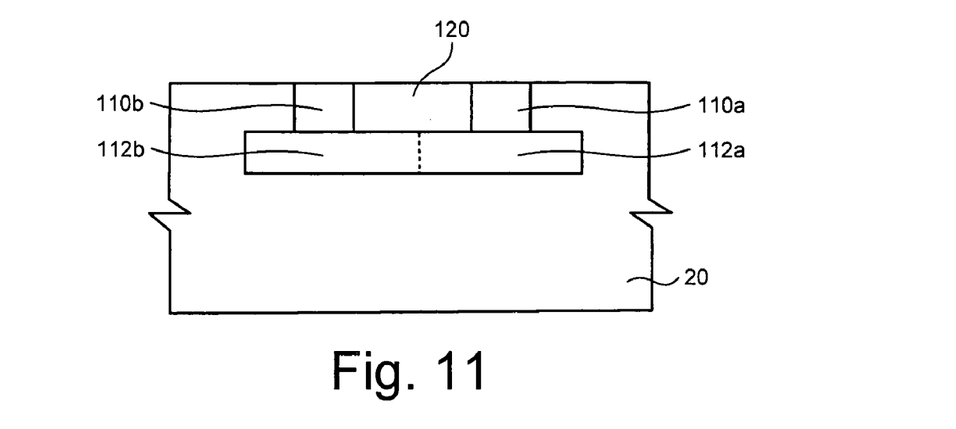
FIG. 11 is a cross-sectional view that illustrates methods of forming at least two silicon oxide isolation regions at different depths and widths in the semiconductor substrate, and in which two laterally adjacent ones of the isolation regions extend into one another form to form a continuous silicon oxide isolation region extending therebetween in accordance with some embodiments of the present invention.

FIG. 11 is a cross-sectional view that illustrates methods of forming at least two silicon oxide isolation regions at different depths and widths in the semiconductor substrate, and in which two adjacent ones of the isolation regions extend into one another form to form a continuous silicon oxide isolation regions extending therebetween in accordance with some embodiments of the present invention. FIG. 11 is similar to FIG. 10, except that two pairs of stacked silicon oxide regions 110a-b and 112a-b have been formed in the semiconductor substrate 20. The silicon oxide regions 112a-b can be formed deeper and wider in the semiconductor substrate 20 than the silicon oxide regions 110a-b by implanting oxygen ions at a first dosage and first energy to allow formation of the silicon oxide regions 112a-b, and implanting oxygen ions at a lower second dosage and lower second energy to allow formation of the silicon oxide regions 110a-b. The first dosage is selected to be sufficiently high so that the resulting silicon oxide regions 112a-b have a sufficient width to extend into one another and form a continuous region extending therebetween.

The silicon oxide regions 112a-b define an active region 120 in the semiconductor substrate 20, and isolate the active region 120 from other peripheral regions of the semiconductor substrate 20.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of fabricating a semiconductor device, the method comprising:
   forming a mask pattern on a semiconductor substrate that contains silicon and which exposes defined regions of the semiconductor substrate;
   implanting oxygen ions into the defined regions of the semiconductor substrate using the mask pattern as an ion implantation mask; and
   annealing the oxygen ion implanted regions of the semiconductor substrate at one or more temperatures in a range to form silicon oxide substantially throughout the oxygen ion implanted regions by reacting the implanted oxygen ions with the silicon in the oxygen ion implanted regions, and to substantially prevent oxidation of the semiconductor substrate adjacent to the oxygen ion implanted regions,
   wherein annealing the oxygen ion implanted regions of the semiconductor substrate comprises steam annealing the oxygen ion implanted regions at one or more temperatures in a range of about 400° to about 800° C., and generating a laser beam that heats the oxygen ion implanted regions to react the implanted oxygen ions with silicon in the oxygen ion implanted regions of the semiconductor substrate, and
   preheating the semiconductor substrate before generating the laser beam to reduce a temperature gradient between the laser heated regions of the semiconductor substrate and peripheral regions of the semiconductor substrate.

2. The method of claim 1, wherein annealing the oxygen ion implanted regions of the semiconductor substrate comprises:

steam annealing the oxygen ion implanted regions in an ambient gas including argon, nitrogen, hydrogen, and/or oxygen.

3. The method of claim 2, wherein the concentration of a steam vapor to ambient gas while annealing has a molecular weight ratio in a range of about 5% to about 100%.

4. The method of claim 1, wherein generating a laser beam comprises controlling the laser beam to sequentially heat individual ones of the oxygen ion implanted regions to a sufficient temperature to react the implanted oxygen ions with silicon in the oxygen ion implanted regions while avoiding heating of adjacent regions of the semiconductor substrate to a temperature sufficient to cause oxidation of the adjacent regions of the semiconductor substrate.

5. The method of claim 1, wherein preheating the semiconductor substrate before generating the laser beam comprises preheating the semiconductor substrate to above about 100° C. and maintaining the semiconductor substrate at one or more temperatures above about 100° C. while generating the laser beam to reduce a temperature gradient between the laser heated regions of the semiconductor substrate and peripheral regions of the semiconductor substrate.

6. The method of claim 1, wherein generating a laser beam is carried out using a Nd Yttrium-Aluminum-Garnet (YAG) laser apparatus, a carbon dioxide laser apparatus, and/or an excimer laser apparatus.

7. The method of claim 1, wherein implanting oxygen ions comprises implanting the oxygen ions at a dosage range of about $1.0 \times 10^{13}$ to about $1.0 \times 10^{19}$ ions/cm$^2$ into the defined regions of the semiconductor substrate using the mask pattern as an ion implantation mask.

8. The method of claim 7, wherein implanting oxygen ions comprises implanting the oxygen ions at a dosage range of about $1.0 \times 10^{14}$ to about $1.0 \times 10^{15}$ ions/cm$^2$.

9. The method of claim 1, wherein forming a mask pattern comprises:
forming a photoresist layer on the semiconductor substrate; and
patterning the photoresist layer to form the mask pattern which exposes the oxygen ion implanted regions of the semiconductor substrate.

10. The method of claim 9, further comprising removing the photoresist layer after implanting the impurity ions and before annealing the defined implantation regions of the semiconductor substrate so that the photoresist layer does not contaminate the semiconductor substrate during the annealing.

11. The method of claim 1, wherein forming a mask pattern on a semiconductor substrate comprises:
formed a mask layer from at least one of a silicon oxide layer, a silicon nitride layer, and a silicon carbide layer on the semiconductor substrate; and
patterning the mask layer to form the mask pattern which exposes regions of the semiconductor substrate.

12. The method of claim 11, wherein annealing the oxygen ion implanted regions of the semiconductor substrate is carried out using the mask pattern to inhibit oxidation of regions of the semiconductor substrate covered by the mask pattern, and further comprising removing the mask pattern after annealing the defined implantation regions of the semiconductor substrate.

13. A method of fabricating a semiconductor device, the method comprising:
forming a mask pattern on a semiconductor substrate that contains silicon and which exposes defined regions of the semiconductor substrate;
implanting oxygen ions into the defined regions of the semiconductor substrate using the mask pattern as an ion implantation mask including by implanting oxygen ions at a first dose and with a first energy into the defined regions of the semiconductor substrate using the mask pattern as an ion implantation mask, implanting oxygen ions at a second dose and with a second energy into the defined regions of the semiconductor substrate using the mask pattern as an ion implantation mask, and implanting oxygen ions at a third dose and with a third energy into the defined regions of the semiconductor substrate using the mask pattern as an ion implantation mask, wherein the first, second, and third doses are different from one another and the first, second, and third energies are different from one another; and
annealing the oxygen ion implanted regions of the semiconductor substrate at one or more temperatures in a range to form silicon oxide substantially throughout the oxygen ion implanted regions by reacting the implanted oxygen ions with the silicon in the oxygen ion implanted regions, and to substantially prevent oxidation of the semiconductor substrate adjacent to the oxygen ion implanted regions,
wherein annealing the oxygen ion implanted regions of the semiconductor substrate comprises steam annealing the oxygen ion implanted regions at one or more temperatures in a range of about 400° to about 800° C.

14. The method of claim 13, wherein:
the first dose is greater than the second dose;
the second dose is greater than the third dose;
the first energy is greater than the second energy; and
the second energy is greater than the third energy.

15. The method of claim 14, wherein:
the annealing is carried out after the oxygen ions are implanted at the first, second, and third doses;
the annealing of the impurity ions implanted at the first dose and first energy forms a first silicon oxide region having a first depth and a first width in the semiconductor substrate;
the annealing of the impurity ions implanted at the second dose and second energy forms a second silicon oxide region having a second depth, which is less than the first depth, and having a second width, which is less than the first width, in the semiconductor substrate; and
the annealing of the impurity ions implanted at the third dose and third energy forms a third silicon oxide region having a third depth, which is less than the second depth, and having a third width, which is less than the second width, in the semiconductor substrate.

16. The method of claim 15, wherein the first dose is selected to be sufficiently high so that when the impurity ions implanted at the first dose are annealed, the resulting first silicon oxide regions of at least two laterally adjacent ones of the defined regions of the semiconductor substrate extend into one another to form a continuous first silicon oxide region extending across the at least two adjacent ones of the defined regions.

17. A method of fabricating a semiconductor device, the method comprising:
forming a mask pattern on a semiconductor substrate that contains silicon and which exposes defined regions of the semiconductor substrate;
implanting oxygen ions into the defined regions of the semiconductor substrate using the mask pattern as an ion implantation mask including by implanting oxygen ions at a first dose and with a first energy into the defined regions of the semiconductor substrate using the mask pattern as an ion implantation mask, and implanting oxygen ions at a second dose, which is different than the first dose, and with a second energy, which is different from the first energy, into the defined regions of the semiconductor substrate using the mask pattern as an ion implantation mask, wherein the first dose of the implanted oxygen ions is greater than the second dose of the implanted oxygen ions, and wherein the first energy of the implanted oxygen ions is greater than the second energy of the implanted oxygen ions; and annealing the oxygen ion implanted regions of the semiconductor substrate at one or more temperatures in a range to form silicon oxide substantially throughout the oxygen ion implanted regions by reacting the implanted oxygen ions with the silicon in the oxygen ion implanted regions, and to substantially prevent oxidation of the semiconductor substrate adjacent to the oxygen ion implanted regions, wherein annealing the oxygen ion implanted regions of the semiconductor substrate comprises steam annealing the oxygen ion implanted regions at one or more temperatures in a range of about 400° to about 800° C. and wherein:

the annealing is carried out after the oxygen ions are implanted at the first and second doses;

the annealing of the impurity ions implanted at the first dose and first energy forms a first silicon oxide region having a first depth and a first width in the semiconductor substrate; and the annealing of the impurity ions implanted at the second dose and second energy forms a second silicon oxide region having a second depth, which is less than the first depth, and having a second width, which is less than the first width, in the semiconductor substrate.

\* \* \* \* \*